US012146235B2

(12) United States Patent
McHugh et al.

(10) Patent No.: US 12,146,235 B2
(45) Date of Patent: Nov. 19, 2024

(54) PLATING AND DEPLATING CURRENTS FOR MATERIAL CO-PLANARITY IN SEMICONDUCTOR PLATING PROCESSES

(71) Applicant: Applied Materials, Inc., Santa Clara, CA (US)

(72) Inventors: Paul R. McHugh, Kalispell, MT (US); Charles Sharbono, Whitefish, MT (US); Jing Xu, Kalispell, MT (US); John L. Klocke, Kalispell, MT (US); Sam K. Lee, Kalispell, MT (US); Keith Edward Ypma, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/686,129

(22) Filed: Mar. 3, 2022

(65) Prior Publication Data

US 2023/0279576 A1 Sep. 7, 2023

(51) Int. Cl.
*C25D 5/18* (2006.01)
*C25D 5/02* (2006.01)
(Continued)

(52) U.S. Cl.
CPC .............. *C25D 5/18* (2013.01); *C25D 5/022* (2013.01); *C25D 7/123* (2013.01); *C25D 17/001* (2013.01);
(Continued)

(58) Field of Classification Search
CPC ............ C25D 7/12–123; C25D 17/001; H01L 21/2885; H01L 21/76873; H01L 2224/11462
See application file for complete search history.

(56) References Cited

U.S. PATENT DOCUMENTS

2002/0033341 A1 3/2002 Taylor et al.
2004/0115932 A1* 6/2004 Cheng ................. H05K 3/241
205/97
(Continued)

FOREIGN PATENT DOCUMENTS

CN 111492096 A 8/2020
CN 113454766 A 9/2021
(Continued)

OTHER PUBLICATIONS

Ramgraber, Original & Machine Translation, DE 10 2007 022 016 B3 (Year: 2007).*
(Continued)

*Primary Examiner* — Hosung Chung
(74) *Attorney, Agent, or Firm* — Kilpatrick Townsend & Stockton LLP

(57) ABSTRACT

A method of plating substrates may include placing a substrate in a plating chamber comprising a liquid, and applying a current to the liquid in the plating chamber to deposit a metal on exposed portions of the substrate, where the current may include alternating cycles of a forward plating current and a reverse deplating current. To determine the current characteristics, a model of a substrate may be simulated during the plating process to generate data points that relate characteristics of the plating process and a pattern on the substrate to a range nonuniformity of material formed on the substrate during the plating process. Using information from the data points, values for the forward and reverse currents may be derived and provided to the plating chamber to execute the plating process.

20 Claims, 11 Drawing Sheets

(51) Int. Cl.
*C25D 7/12* (2006.01)
*C25D 17/00* (2006.01)
*C25D 21/12* (2006.01)
*G06F 30/20* (2020.01)
*H01L 21/768* (2006.01)

(52) U.S. Cl.
CPC ............. *C25D 21/12* (2013.01); *G06F 30/20* (2020.01); *H01L 21/76898* (2013.01)

(56) References Cited

U.S. PATENT DOCUMENTS

| | | | |
|---|---|---|---|
| 2005/0183959 A1* | 8/2005 | Wilson | C25D 7/123 205/157 |
| 2007/0181441 A1* | 8/2007 | Kovarsky | C25D 7/123 205/646 |
| 2009/0139870 A1* | 6/2009 | Nagai | H01L 21/2885 204/273 |
| 2009/0159451 A1* | 6/2009 | Tomantschger | C25D 1/00 205/148 |
| 2013/0295287 A1 | 11/2013 | Tsukamoto | |
| 2014/0329381 A1* | 11/2014 | Zhang | H01L 24/13 438/613 |
| 2015/0225866 A1* | 8/2015 | Lee | H01L 21/32115 205/640 |
| 2015/0299886 A1 | 10/2015 | Doubina et al. | |
| 2016/0068985 A1 | 3/2016 | Wang et al. | |
| 2016/0068988 A1* | 3/2016 | Uzoh | F02C 7/042 204/222 |
| 2020/0105705 A1* | 4/2020 | Cheng | H01L 25/50 |

FOREIGN PATENT DOCUMENTS

| | | | | |
|---|---|---|---|---|
| EP | 1069212 A1 * | 1/2001 | ........... | C25D 17/001 |
| EP | 3372710 A1 * | 9/2018 | | |
| KR | 20090048358 A | 5/2009 | | |
| WO | 2004097932 A2 | 11/2004 | | |

OTHER PUBLICATIONS

International Search Report and Written Opinion mailed on May 10, 2023 in International Patent Application No. PCT/US2023/010758, 7 pages.

* cited by examiner

PLATING AND DEPLATING CURRENTS FOR MATERIAL CO-PLANARITY IN SEMICONDUCTOR PLATING PROCESSES

TECHNICAL FIELD

The field of the invention is electroplating semiconductor material substrates or wafers, and similar types of substrates.

BACKGROUND

Metallization of electrical connections has been widely used in many semiconductor applications, ranging from dual damascene to various packaging structures, including C4 bumping, pillars, micro-bumps, redistribution layers (RDL), thru-silicon vias (TSV), etc. Such metallization is commonly carried out using techniques such as electro-deposition of different metals, such as copper, gold, nickel, solder, and others. As technology advances, the chip layout increasingly has features and pattern densities that are difficult to plate or metallize uniformly.

Electro-deposition of advanced microelectronic device packaging often uses a mask or a photoresist layer to define the pattern of metal lines or contacts. The pattern can also be defined by non-reacting or non-conducting surfaces. As used here, the term patterned substrate means a substrate having a mask or photoresist layer or non-reacting or non-conducting regions. The pattern density may vary between sparsely patterned regions and densely patterned regions. This causes corresponding variations in local current density and ion concentration differences, which affect deposition thickness uniformity within a die (the so-called within die nonuniformity, or WID non-uniformity).

One technique for improving thickness uniformity or thickness levelling is to reduce the applied current density overall. Alternatively, a plating bath with a high throwing power may be used. Throwing power can be defined as the ability of a plating bath to produce deposits of more or less uniform thickness on cathodes having macroscopic irregularities. The higher the throwing power, the more uniform the resulting deposit. In the case of a copper-acid bath, for example, a common bath formulation with high throwing power would be one with low copper concentration and high acid concentration. However, improved plating techniques are needed.

SUMMARY

In some embodiments, a method of plating substrates, may include placing a substrate in a plating chamber comprising a liquid, and applying a current to the liquid in the plating chamber to deposit a metal on exposed portions of the substrate, wherein the current comprises alternating cycles of a forward plating current and a reverse deplating current.

In some embodiments, a system may include a plating chamber including a liquid configured to receive a substrate, and a controller that may be configured to cause a current to be applied to the liquid in the plating chamber to deposit a metal on exposed portions of the substrate, where the current may include alternating cycles of a forward plating current and a reverse deplating current.

In some embodiments, a non-transitory computer-readable medium may include instructions that, when executed by one or more processors, cause the one or more processors to perform operations including simulating a model of a substrate in a plating process to generate data points that relate characteristics of the plating process and a pattern on the substrate to a range nonuniformity of material formed on the substrate during the plating process; using information from the data points, determining values for a forward plating current and a reverse deplating current to be applied in a plating chamber; and providing the values for the forward plating current and the reverse deplating current to the plating chamber to execute a plating process.

In any embodiments, any and all of the following features may be implemented in any combination and without limitation. The substrate may include a photoresist or mask layer that defines a pattern on the substrate, and the pattern may include exposed portions of the substrate adjacent to an open area, where a current density during a plating process may be more concentrated at the exposed portions of the substrate adjacent to the open area compared to exposed portions of the substrate that are not adjacent to the open area. During the forward plating current, the metal may be deposited unevenly on the exposed portions of the substrate. During the reverse deplating current, the metal may be removed such that the metal becomes evenly distributed on the exposed portions of the substrate. The forward plating current and the reverse deplating current may both applied in the alternating cycles in the plating chamber when the substrate is in the liquid, without using separate chambers or liquids to apply the forward plating current and the reverse deplating current. The exposed portions of the substrate may include a plurality of thru-silicon vias (TSVs), where a difference between a maximum height of the TSVs and a minimum height of the TSVs may be greater than a threshold distance. Prior to applying the current to the liquid in the plating chamber, the method/operations may also include simulating a model of the substrate during a plating process to generate data points that relate characteristics of the plating process and a pattern on the substrate to a predicted range nonuniformity of the metal on the substrate for the forward plating current and the reverse deplating current. Prior to applying the current to the liquid in the plating chamber, the method/operations may also include determining a value for the reverse deplating current using the data points that relate the characteristics of the plating process and the pattern on the substrate to the predicted range nonuniformity of the metal on the substrate. Prior to applying the current to the liquid in the plating chamber, the method/operations may also include determining a duty cycle for the alternating cycles of the forward plating current and the reverse deplating current using the data points that relate the characteristics of the plating process and the pattern on the substrate to the predicted range nonuniformity of the metal on the substrate. The controller may be further configured to apply the alternating cycles of the forward plating current and the reverse deplating current based at least in part on a rotation speed of the substrate in the plating chamber. The controller may be further configured to apply the alternating cycles of the forward plating current and the reverse deplating current based at least in part on a motion of a paddle in the plating chamber. The plating chamber may include an electrochemical deposition chamber, and the liquid may include an electrolyte. The forward plating current may be applied at least 10 times as long as the deplating current. Determining the values for the forward plating current and the reverse deplating current may include receiving a target deposition rate for the plating process; receiving a forward plating rate for the plating process; determining a reverse deplating rate for the plating process; and/or determining a duty cycle for the forward plating current and the reverse deplating current based on the target deposition rate, the forward plating rate, and the reverse deplating rate. The reverse deplating rate may minimize the range nonuniformity of the material formed on the substrate during the plating process. The data points that relate characteristics of a plating process and a pattern on the substrate to a range nonuniformity of material formed on the substrate during the plating process may include a linear or a non-linear relationship.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

The embodiments described herein provide an improved method for plating a substrate with material while maximizing within-die uniformity and co-planarity. Each patterned substrate will react differently in a plating chamber, having unique patterns, masks, and amounts/locations of open areas on the die. These open areas that are covered with a mask or photoresist layer may cause current to pool on adjacent exposed areas during the plating process, causing more material to be deposited on those adjacent exposed areas. Traditionally, the substrate was then transferred from the plating chamber to a separate deplating chamber into a electrochemical bath having a lower conductivity. A reverse current was then applied to remove the excess material on the substrate such that vias and traces ended up at a uniform height. However, the transfer of the substrates to a separate chamber, the use of different chemistries in the liquids, and the changes in throwing power used during the plating process resulted in bottlenecks when processing batches of substrates having the same pattern.

These embodiments improve the batch processing of patterned substrates and improve the uniformity of the plating process by maintaining the substrate in the same processing chamber and in the same liquid bath to apply alternating current cycles of a forward plating current and a reverse deplating current. The process may first generate a plot or relationship of data that relates the range nonuniformity to the physical parameters of the process. This data set may then be used to calculate the portion of the duty cycle during which the forward plating current in the reverse deplating current may be applied. This curve may also be used to determine the forward and reverse currents that should be applied to reach a target plating rate. The frequency of the forward/reverse current cycle may be aligned with the substrate rotation and paddle movements in the chamber to ensure that the process is evenly applied. This incremental application and removal of material using forward and reverse currents in the same chamber improves the overall uniformity of the material heights across dies, die coupons, and substrates as a whole, and greatly improves the speed with which each substrate may be processed.

By way of example, a plating chamber that uses electrochemical deposition (ECD) processes is described below. However, other plating processes in addition to ECD may be used with the forward/reverse current techniques described herein. Therefore, this specific ECD chamber and ECD processes in general are not meant to be limiting.

Figure 1:
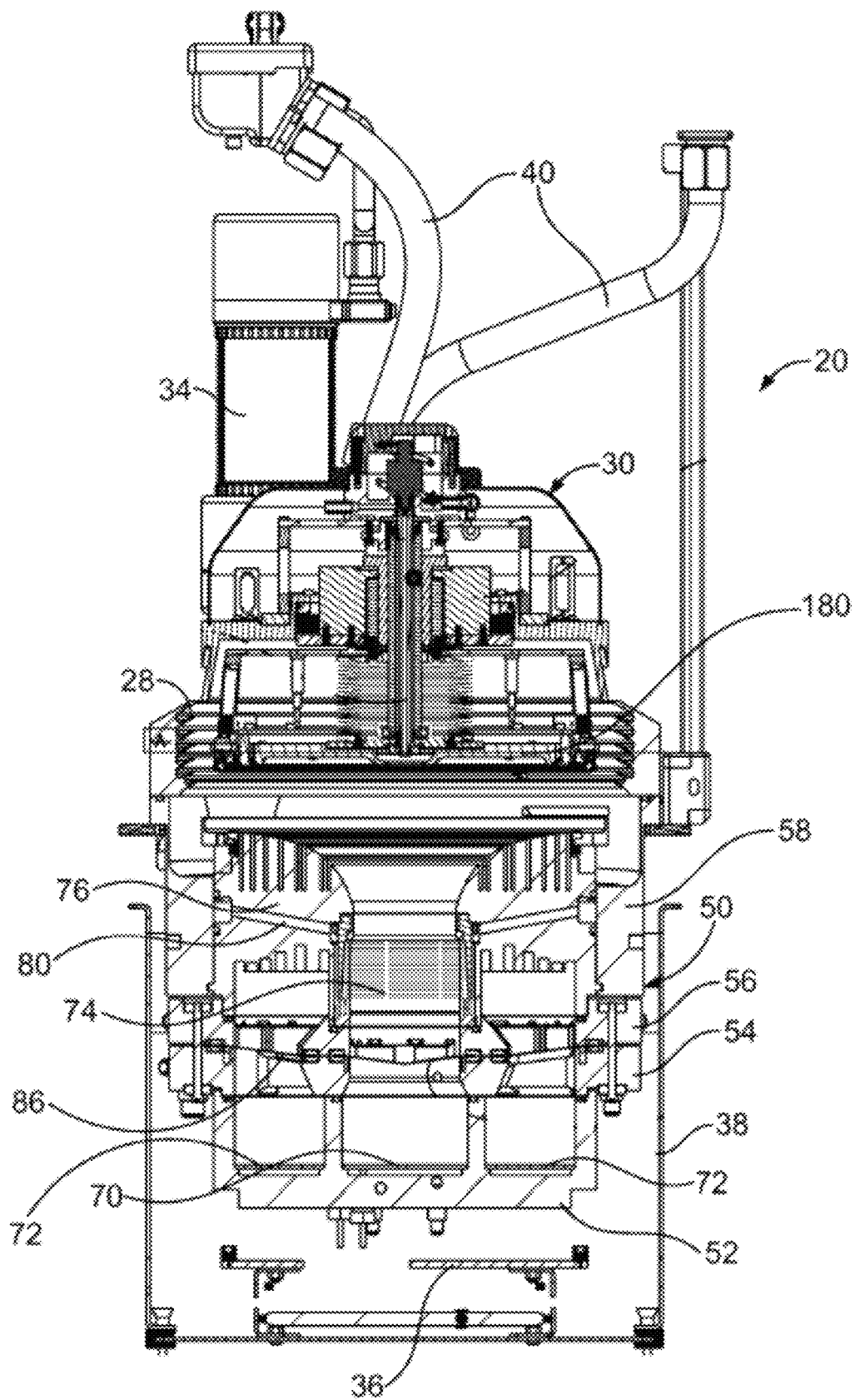
FIGS. 1-2 illustrate an electrochemical processor, according to some embodiments.
Figure 2:
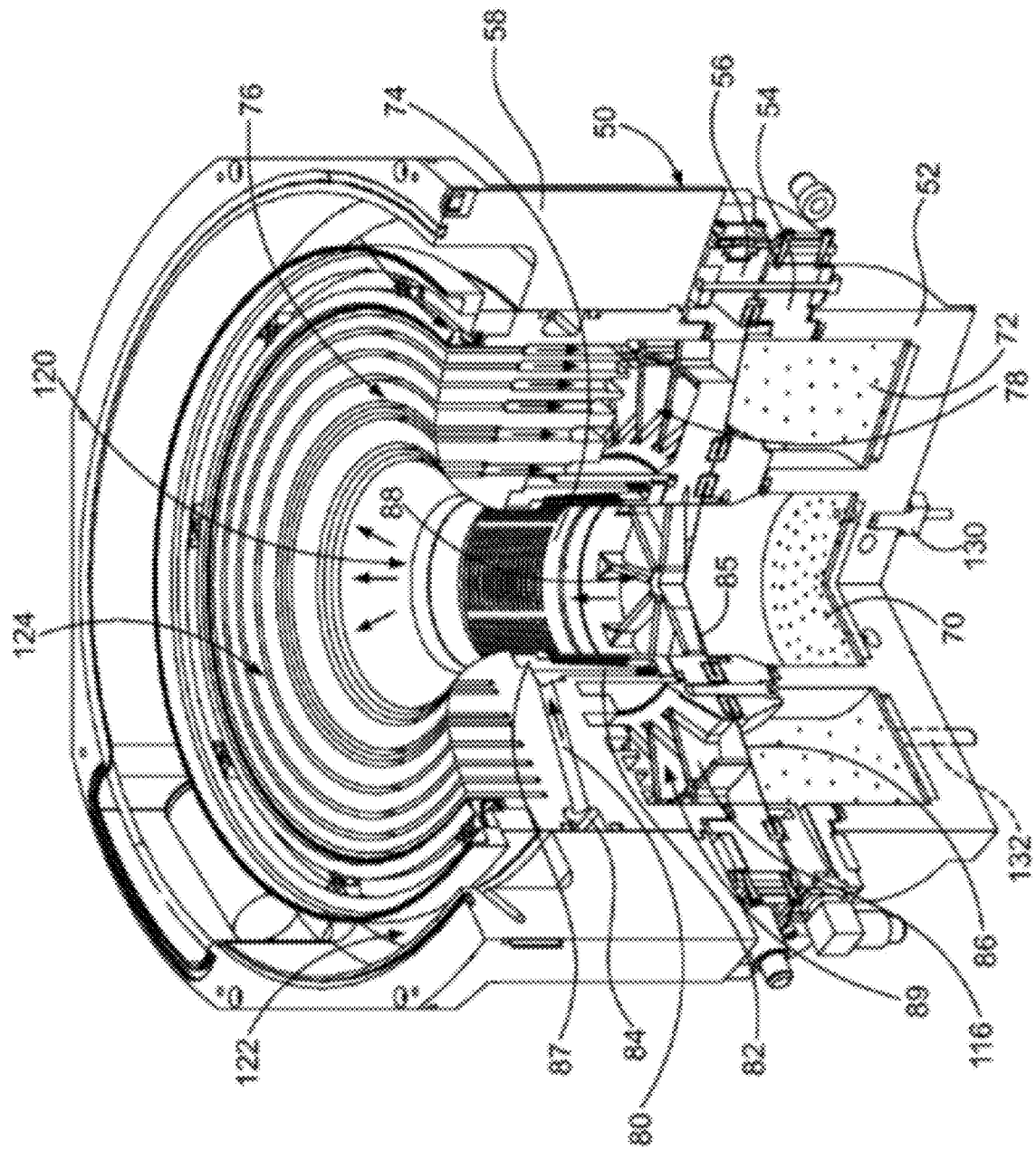

FIGS. 1-2 illustrate an electrochemical processor 20, according to some embodiments. The electrochemical processor 20 may include a head positioned above a vessel assembly 50. The vessel assembly 50 may be supported on deck plate 24 and a relief plate 26 attached to a stand 38 or other structure. A single processor 20 may be used as a standalone unit. Alternatively, multiple processors 20 may be provided in arrays with workpieces loaded and unloaded in and out of the processors by one or more robots. A head 30 may be supported on a lift/rotate unit 34, for lifting and inverting the head to load and unload a workpiece into the head, and for lowering the head 30 into engagement with the vessel assembly 50 for processing.

Electrical control and power cables 40 may be linked to the lift/rotate unit 34 and to internal head components and may lead up from the processor 20 to facility connections, or to connections within multi-processor automated system. A rinse assembly 28 having tiered drain rings may be provided above the vessel assembly 50. A drain pipe 42 may connect the rinse assembly 28, if used, to a facility drain. An optional lifter 36 may be provided underneath the vessel assembly 50 to support the anode cup during changeover of the anodes. Alternatively, the lifter 36 may be used to hold the anode cup up against the rest of the vessel assembly 50.

The vessel assembly 50 may include an anode cup 52, a lower membrane support 54, and upper membrane support 56 held together with fasteners 60. Within the anode cup 52, a first or inner anode 70 may be positioned near the bottom of an inner anolyte chamber 110. A second or outer anode 72 may be positioned near the bottom of an outer anolyte chamber 112 surrounding the inner anolyte chamber 110. The inner anode 70 may be a flat round metal plate, and the outer anode 72 may be flat ring-shaped metal plate, for example, a platinum plated titanium plate. The inner and outer anolyte chambers may be filled with copper pellets. The inner anode 70 may be electrically connected to a first electrical lead or connector 130, and the outer anode 72 may be electrically connected to a separate second electrical lead or connector 132. In some embodiments, for example for processing 300 mm diameter wafers, the processor may have a center anode, and a single outer anode. Designs having three or more anodes may also optionally be used, especially with even larger wafers.

An upper cup 76 may be contained within or surrounded by an upper cup housing 58. The upper cup housing 58 may be attached to and sealed against the upper cup 76. The upper cup 76 may have a curved upper surface 124 and a central through opening that forms a central or inner catholyte chamber 120. This chamber 120 is defined by the generally cylindrical space within a diffuser 74 leading into the bell or horn shaped space defined by the curved upper surface 124 of the upper cup 76. A series of concentric annular slots extend downwardly from the curved upper surface 124 of the upper cup 76. An outer catholyte chamber 78 formed by the bottom of the upper cup 76 is connected to the rings via an array of tubes or other passageways.

Similarly, a second or outer membrane 86 may be secured between the upper and lower membrane supports and may separate the outer anolyte chamber 112 from the outer catholyte chamber 78. An outer membrane support 89, which may be provided in the form of radial legs 116 on the upper membrane support 56, supports the outer membrane from above.

A diffuser circumferential horizontal supply duct 84 may be formed in an outer cylindrical wall of the upper cup 76, with the duct 84 sealed by O-rings or similar elements between the outer wall of the upper cup 76 and the inner cylindrical wall of the upper cup housing 58. Radial supply ducts 80 may extend radially inwardly from the circumferential duct 84 to an annular shroud plenum 87 surrounding the upper end of the diffuser shroud 82. The radial ducts 80 pass through the upper cup 76 in between the vertical tubes connecting the annular slots in the curved upper surface 124 of the upper cup 76 to the outer catholyte chamber 78. The circumferential duct 84 and the radial ducts 80 lead to the shroud plenum 87, and the outer catholyte paths may be formed between the diffuser shroud 82 and the diffuser 74. These outer catholyte paths may ordinarily be filled with liquid catholyte during operation of the processor 20.

In use, a workpiece, typically having an electrically conductive seed layer, is loaded into the head. In some embodiments, the workpiece may be first loaded into a wafer carrier or a wafer holder, and the wafer carrier/folder may then be transferred into the chamber. The seed layer on the workpiece is connected to an electrical supply source, typically to the cathode. If the head is loaded in a face up position, the head is flipped over so that the rotor, and the workpiece held in the rotor, are facing down. The head is then lowered onto the vessel until the workpiece is in contact with the catholyte in the vessel. The spacing between the work piece and the curved upper surface of the upper cup influences the current density uniformity at the workpiece Surface. This gap may be changed during processing. The workpiece may be moved up and away from the surface gradually, or it may be moved quickly from a starting gap to an ending gap. A lift/rotate mechanism may be used to lift the head.

Anolyte is provided into the inner anolyte chamber and separately into the outer anolyte chamber. Catholyte is provided into the circumferential supply duct. Catholyte is supplied to the inlet fitting. The workpiece is moved into contact with the catholyte, typically by lowering the head. Electrical current to the anodes 70 and 72 is switched on with current flowing from the anodes through the anolyte in the inner and outer anolyte chambers. The electrical current from the inner and outer anodes passes through the anolyte and through the inner and outer membranes and into the catholyte contained in the open spaces in the upper cup 76.

Within the upper cup 76, catholyte flows from the supply duct 84 radially inwardly to the diffuser shroud plenum 87 and then into the diffuser 74. The catholyte flows up from the diffuser and moves radially outwardly in all directions over the curved upper surface 124 of the upper cup 76. Metal ions in the catholyte deposit onto the workpiece, building up a metal layer on the workpiece. The motor may be switched on to rotate the rotor and the workpiece, to provide more uniform deposition onto the workpiece. Most of the catholyte then flows into the collection ring 122. A small fraction of the catholyte flows downwardly through the slots and the tubes into the outer catholyte chamber 78. The catholyte then flows out of the processor 20.

Figure 3:
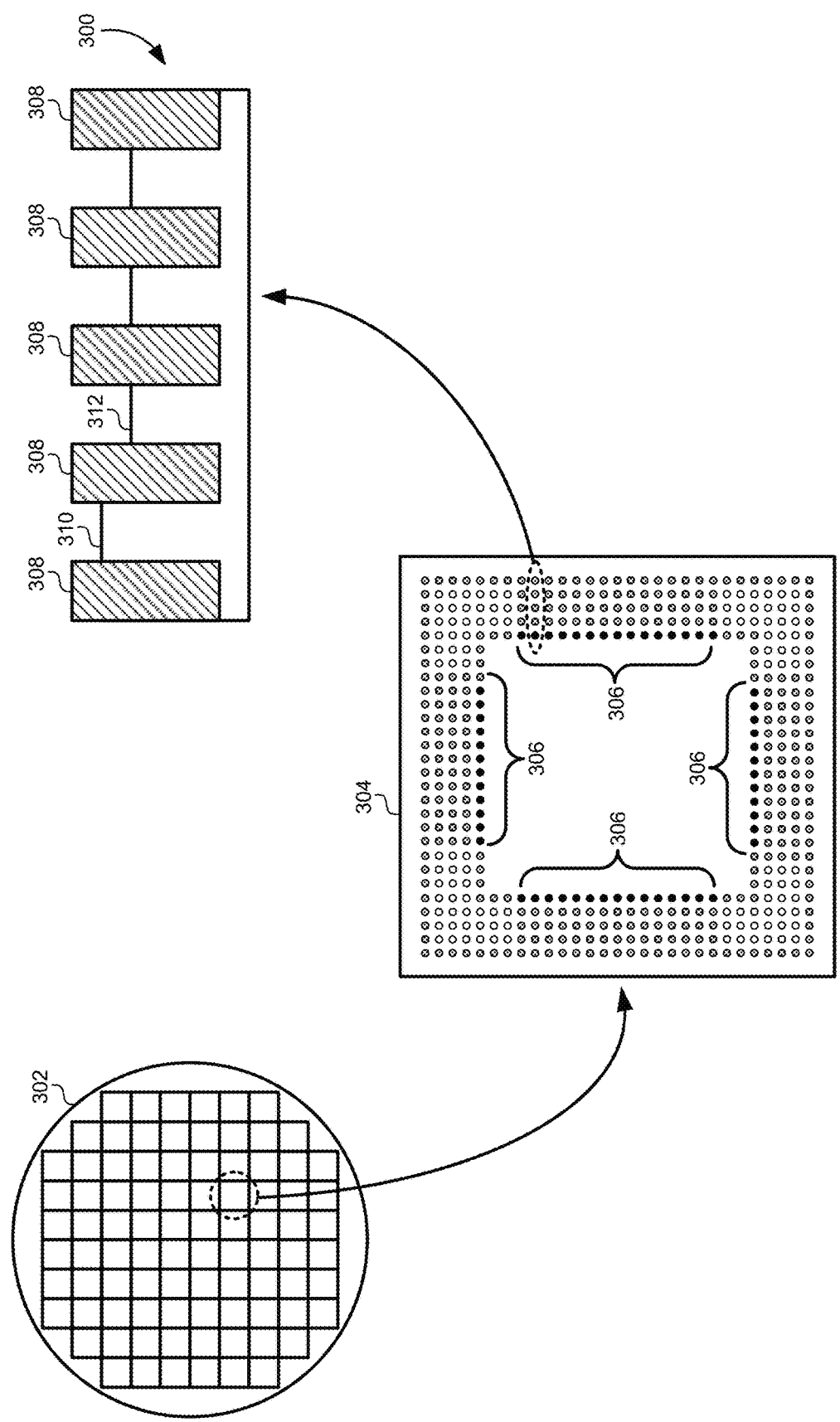
FIG. 3 illustrates a substrate that may be subject to nonuniform plating, according to some embodiments.

FIG. 3 illustrates a substrate 302 that may be subject to nonuniform plating, according to some embodiments. A substrate 302 may include any type of material, such as a silicon semiconductor substrate upon which integrated circuits and other electrical components may be fabricated. The substrate 302 may include multiple individual dies 304. When processing is complete, the substrate 302 may be separated into the individual dies 304 and packaged individually. When considering the uniformity of layers of material that are formed on the substrate 302, some processes may focus on uniformity within a single die 304. Other processes may focus more on uniformity within a coupon, or subset of dies on the substrate 302. Other processes may additionally or alternatively focus on uniformity across the substrate 302 as a whole.

The terms "wafer", "workpiece" and "substrate" may be used here interchangeably. The substrate may have various shapes, sizes, and materials. The present methods may be used in plating copper, as well as other metals such as silver, gold, nickel, cobalt, palladium, tin, etc. A patterned substrate may refer to a substrate that has a photoresist or mask layer that defines a pattern. Alternatively, a patterned substrate may refer to a substrate that contains structures already patterned, such as a redistribution layer (RDL) after photoresist removal, or through-silicon via (TSV) layer after electroplating. Although patterning on a substrate is often the source of plated film non-uniformity, the present methods may be used to provide a more uniform plated film, regardless of the source of the non-uniformity in the initial plated film.

During a plating process, the substrate 302 may be immersed in a liquid electrolyte, and a forward current may be applied to anodes in the chamber to deposit a layer of metal on the substrate 302. For example, each die 304 may include a mask or photoresist layer that covers the die 304. Areas on the mask may leave portions of the substrate exposed to the plating process. In this example, the mask on the die 304 may leave a series of circular openings on the surface of the die 304 where metal vias may be deposited. Any voids in the mask that leave the substrate exposed to the plating process may be referred to as "exposed" areas of the substrate.

An object of most plating processes is to uniformly deposit material on the exposed areas of the substrate 302. However, each new design for a substrate pattern may have its own unique layout of open areas, feature densities, and circuit patterns as defined by the mask during the plating process. Because these patterns will be different for every design, currents may be pooled differently during the plating process. For example, the die 304 includes a large open area in the center of the die 304. As used herein, the term "open"

areas may refer to areas that do not include features or voids in the mask that leave the substrate exposed. For example, a large open area on the die 304 would include the center section of the die 304 where the density of the exposed areas is significantly less than the areas with the vias that surround the open area. The chemistry bath liquid may cover the die uniformly, and the current may flow through the chemistry in a relatively uniform manner. However, open areas may cause the current flux from those open areas to be funneled into the adjacent vias during electroplating. It is also harder for current be delivered uniformly into relatively dense via areas. For example, current may tend to pool or concentrate in the open area at the center of the die 304 and thus be funneled more heavily into features that are defined by the exposed portions of the substrate 302 that are adjacent to the open area. This may include the vias 306 that are adjacent to the open area. When more current is funneled into these vias that are adjacent to the open area, more material will be deposited in these vias during the plating process.

A cross-sectional view 300 of the die 304 illustrates how an exposed area 310 of the die 304 that is adjacent to the open area in the center of the die 304 may result in more material being plated in the exposed area 310. The photo-resist mask 308 may leave the vias open (e.g., 200 microns deep), then fill the vias with metal during the plating process. This results in a via having a taller height than other exposed areas 312 that are not adjacent to the open areas, even though the mask 308 may have the same uniform height. Co-planarity may be defined as the difference between a maximum height of a via (or other feature) and a minimum height of a via (or other feature). Co-planarity is typically measured as the max-min on the same die 304, but may also be measured on a coupon of dies and/or the substrate 302 as a whole.

Figure 4:
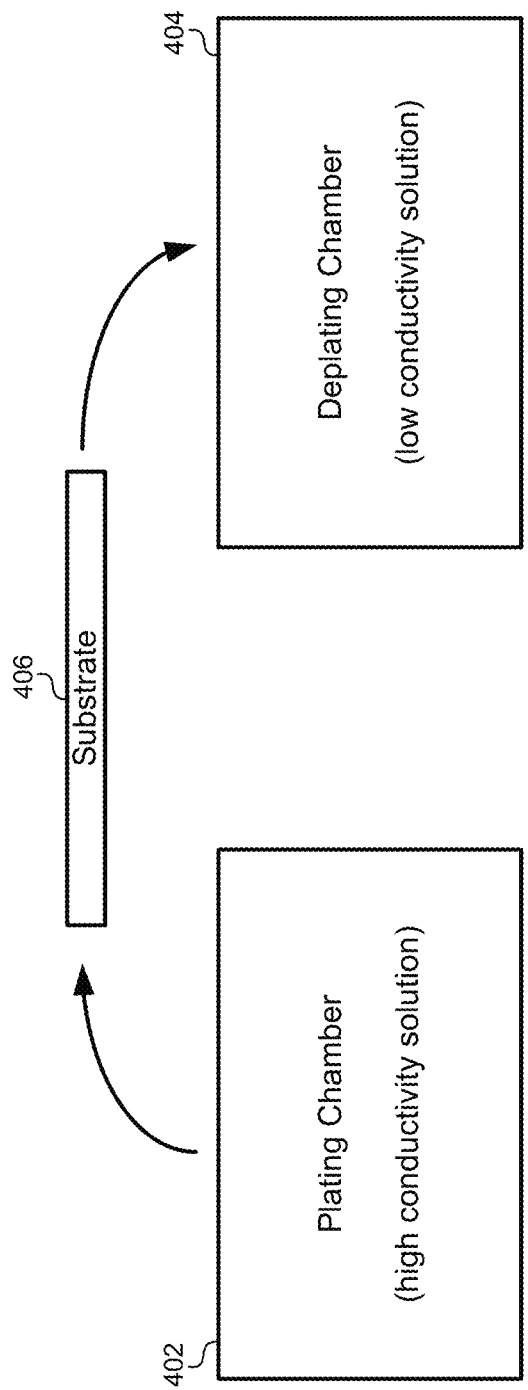
FIG. 4 illustrates a traditional process for plating and deplating material from features to achieve a uniformly co-planar design, according to some embodiments.

FIG. 4 illustrates a traditional process for plating and deplating material from features to achieve a uniformly co-planar design, according to some embodiments. First, the substrate 406 may be placed within a plating chamber 402. The plating chamber 402 may include a liquid chemistry having a relatively high conductivity. A forward current may then be applied through the liquid to perform the plating process. A forward current may be defined as a current configured to cause material to form on the substrate. As described above, this forward current process in the plating chamber 402 may result in features that are not co-planar across a die or the substrate as a whole. The substrate may include a silicon wafer plated with an initial patterned copper film, although other types of substrates and metals may be used. The patterning may affect current density during plating so that the initial plated film is non-uniform to a degree. For example, the initial film may be at least 3, 5, 8 or 10% non-uniform (per three sigma/mean). The initial metal film can be formed in various ways, such as electro-chemical deposition (plating).

In order to remove excess material, the substrate 406 was then moved to a deplating chamber 404 from the plating chamber 402. For example, the deplating chamber 404 would typically include a low-conductivity liquid solution compared to the high-conductivity solution of the plating chamber 402. The deplating chamber 404 would then apply a reverse current through the liquid to perform the deplating process. A reverse current may be defined as a current configured to cause material to be removed from the substrate. Using a lower-conductivity electrolyte bath causes the reverse process to be exaggerated and remove material faster from the vias adjacent to the open space, eventually balancing out the heights of the features across the die. This allows the process to preferentially remove material from the vias that are taller and achieve co-planarity.

For example, the substrate 406 may be moved into the deplating chamber 404 adapted for non-uniform deplating. The deplating chamber 404 may have a low throwing power, such as a throwing power then the plating chamber 402. The deplating bath may have a low conductivity, for example, 1 mS/cm to 250 mS/cm, or from 10 mS/cm to 100 mS/cm. Once in the deplating bath, the plated substrate may be partially electro-etched or deplating in the deplating bath by conducting reverse electrical current through the substrate and the bath. Like the plating step, the deplating step may be non-uniform. For example, the deplating step may remove metal from protrusions faster than from surrounding areas. The remaining metal film may consequently be made more uniform. The deplated substrate 406 may be rinsed and dried, and/or then moved for additional chemical or electrochemical processing.

Figure 5:
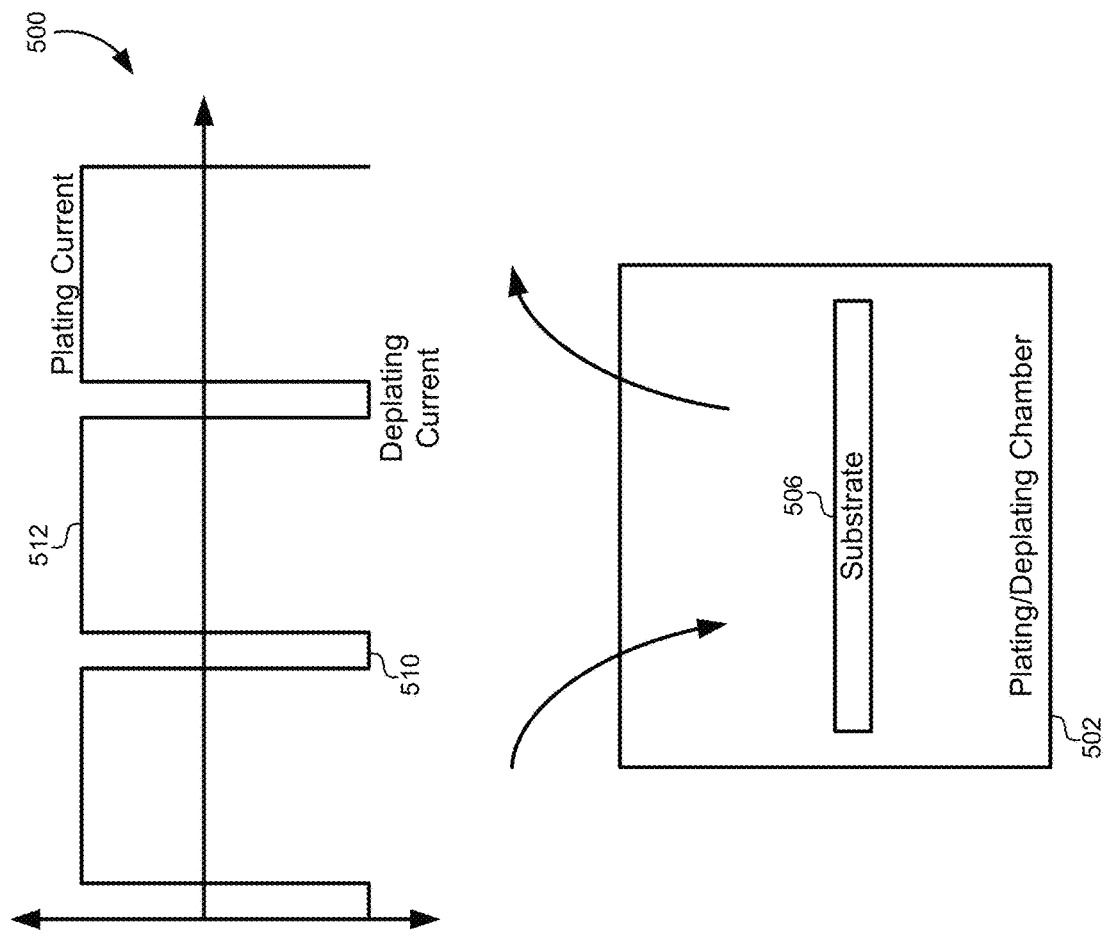
FIG. 5 illustrates a single-chamber configuration for plating and deplating material for co-planarity, according some embodiments.

FIG. 5 illustrates a single-chamber configuration for plating and deplating material for co-planarity, according some embodiments. In order to improve the plating process, the embodiments described herein may use the same chamber 502 to perform the plating and deplating processes described above. This greatly improves the uniformity of the height of the material within a die or substrate, eliminates the need for separate chambers to perform the deplating process, and greatly improves the speed with which batches of substrates may be processed. This also eliminates the need for two separate chemistries to be used in the different liquid baths of the separate chambers.

The substrate 506 may be placed in the plating chamber 502. Plating and deplating currents may then be applied to the substrate 506 in the same liquid or chemical bath for both the plating and deplating processes. For example, the liquid may include a single electrolyte, such as a catholyte or an anolyte from the same solution or the same tank. Instead of relying on changes in the chemistry of the liquid to generate the exaggerated effect required for the deplating process, these embodiments instead duty cycle the forward current 512 and the reverse current 510. The current levels may also be adjusted for the forward current 512 and the reverse current 510 to generate the exaggerated removal effect. Recall that the exaggerated reverse current effect is needed to preferentially remove material from the areas of the substrate exposed through the mask that are subjected current pooling during the plating process. This duty cycling and use of the same chamber allow the process to incrementally correct for differences in the planarity of the die as it occurs rather than generating a very large error and attempting to correct that error in a separate deplating process. This leads to a more accurate and more uniform material height.

The graph 500 illustrated in FIG. 5 illustrates an example of how the forward current 512 can be duty cycled with the reverse current 510 using a square waveform. Typically, the forward current 512 may occupy the majority of the duty cycle in comparison to the reverse current 510. For example, the application of the forward current 512 may be at least 10 times longer than the application of the reverse current 510. Note that the square waveform in the graph 500 is provided only by way of example and is not meant to be limiting. Many other waveforms may be used in addition to regular square waveforms to apply the forward current 512 and the reverse current 510. Some recipes may also use waveforms with varying magnitudes and lengths for the intervals of the forward current 512 and/or the reverse current 510 at different stages of the recipe execution. Some embodiments may also apply the alternating forward current 512 and reverse current 510 during portions of the recipe, while applying other waveforms or DC currents during the remaining portions of the recipe. For example, a recipe for a plating chamber may include alternating reverse and forward current waveforms for part of the recipe and a DC waveform for remainder of the recipe. The recipe may include pulse forward currents, pulse reverse currents, and DC waveforms in any combination and without limitation. Multiple sequences of these waveforms can be executed individually or in loops. Thus, the alternating forward current 512 and reverse current 510 may be applied during all or any sub-portion of a plating process.

Figure 6:
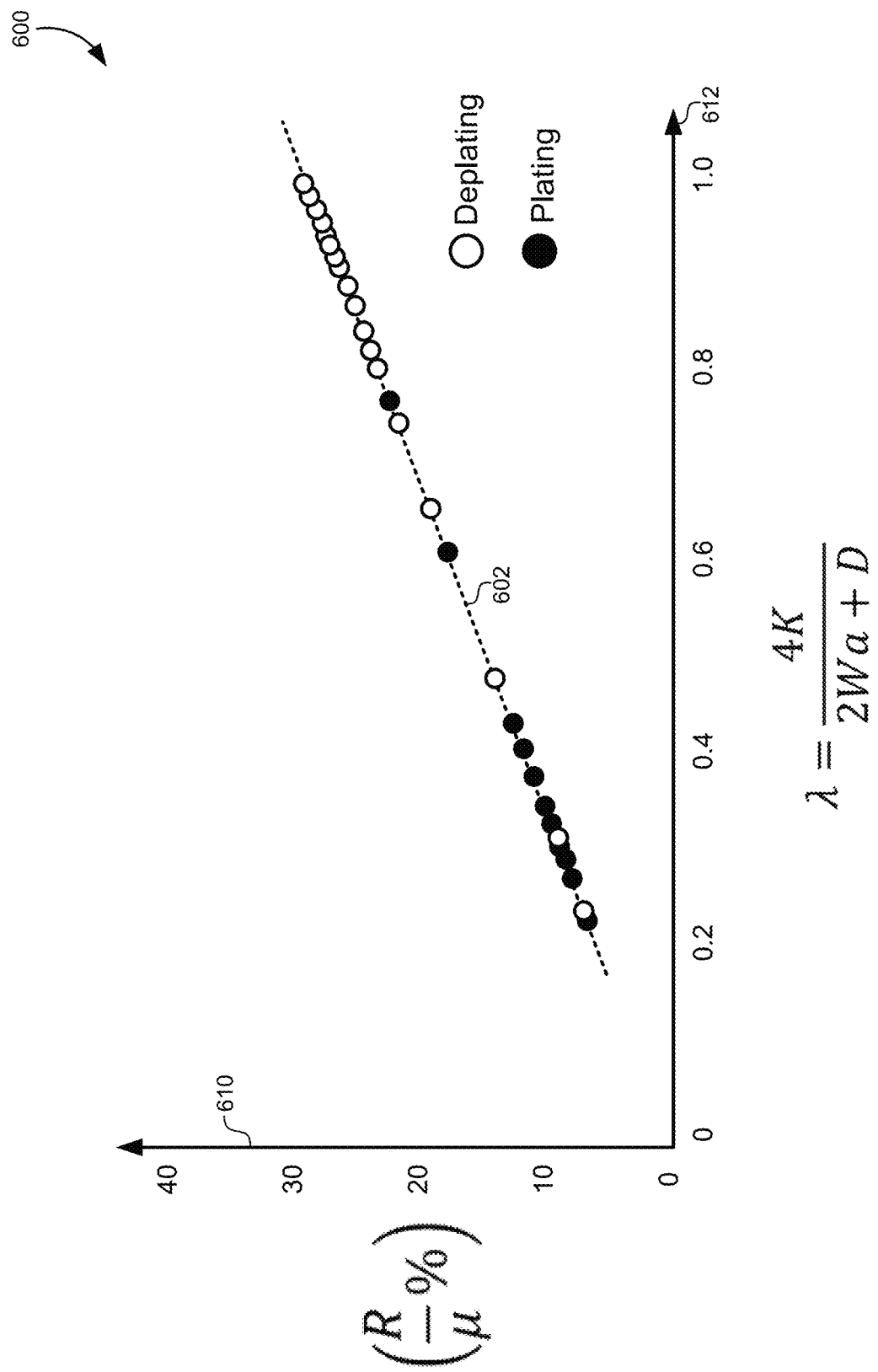
FIG. 6 illustrates a graph and a relationship that may be used to determine the forward current and reverse current characteristics for the combined plating and deplating process in a single chamber, according to some embodiments.

FIG. 6 illustrates a graph 600 and a relationship that may be used to determine the forward current and reverse current characteristics for the combined plating and deplating process in a single chamber, according to some embodiments. Because every substrate design may include a different mask pattern, and because each process may use different target deposition rates, different liquid chemistries, and other unique physical characteristics, each design may be characterized to determine the proper duty cycle and current values for the forward and reverse current supplied during the process. This characterization may take place by simulating models of the physical processes, or using experimental data by performing the plating/deplating process on test substrates. The experimental or simulation data may be gathered prior to executing the plating process on a current substrate (e.g., prior to applying the forward and reverse currents).

The graph 600 includes an x-axis representing a dimensionless parameter 612 that characterizes the substrate pattern and plating chamber conditions. This parameter 612 may be referred to as λ and defined as follows.

$$\lambda = \frac{4K}{2Wa + D} \quad (1)$$

The variables K, Wa, and D used in the definition of the λ parameter 612 may be defined as follows.

$$K = \frac{1}{2}\kappa w Rs \quad (2)$$

$$Wa = \frac{\kappa RT}{aF|j_{ave}|L_{pattern}} \quad (3)$$

$$D = \frac{L_{pattern}}{2w} \quad (4)$$

In these equations (2)-(4), K is a non-dimensional number that represents the product of the bath conductivity κ, the width of the die w, and the film resistance Rs, which represents the film resistivity divided by the film thickness. Wa represents the Wagoner number, which is a non-dimensional number that characterizes the solution and reflects a ratio of the interface resistance to the bath resistance, and which is a well-known characteristic in electrochemistry. In this particular characterization, different α values may be used for plating and deplating (e.g., $\alpha_c$ for plating, and $\alpha_a$ for deplating), yielding different values for Wa for plating and deplating in the same conditions as shown in the graph 600. $L_{pattern}$ may represent the characteristic length of the pattern on the die, and $j_{ave}$ may represent the via average current density. D may represent a distance ratio between the $L_{pattern}$ length of the pattern and the width of the pattern w, which may be approximated as a measure of the distance between sparse and dense regions on the die.

For a particular die pattern, the various variables in the A parameter 612 may be adjusted and simulated to generate a resulting range nonuniformity 610 for those conditions represented on the y-axis of the graph 600. Each data point simulated may be plotted on the graph 600 for both a plating process and a deplating process. Note that these data points may also be gathered with experimental data using different bath conductivities and plating rates to characterize the range nonuniformity 610. Note that graph 600 divides the range nonuniformity 610 by the average range nonuniformity in order to normalize the data so that different bath conductivities and film sheet resistances may be represented on the same graph 600.

A key observation from the ideal data plotted on the graph 600 is that the results are linear when range nonuniformity 610 is plotted against the A parameter 612. This linear relationship holds in both the plating direction and the deplating directions. Thus, the range nonuniformity 610 can be related to a set of operating conditions represented by the A parameter 612 by the slope of the interpolated line 602 through the data points. The slope of this line may be different for each substrate pattern. For example, in this example the slope of the line 610 may be approximately 29.101 using one set of experimental data. Note that with additives or other non-ideal factors, this relationship may be not entirely linear. For nonlinear data, a non-linear relationship can similarly be used to predict the range nonuniformity 610 from a given A parameter 612.

For linear relationships, the information from the data set of the graph 600 can be simplified using a linear approximation. This yields a simple relationship between the range nonuniformity 610 and the λ parameter 612 as follows.

$$\frac{R}{\mu}\% = G(\lambda) = \text{slope} \cdot \lambda \quad (5)$$

Equation (5) assumes a linear relationship between the range nonuniformity 610 and the λ parameter 612 such that the function G(λ) may be replaced with the numerical slope of the linear relationship. For data sets that do not yield a linear relationship, the function G(λ) may instead be replaced with the corresponding nonlinear function, such as an exponential or polynomial function. Using ideal linear data simplifies the quadratic solution process described below. However, for nonlinear relationships, numerical solution methods may instead be used to solve the following equations for the duty cycle and deplating current. This relationship may thus be used to relate the characteristics of the plating process and the pattern on the substrate to a predicted range nonuniformity of the metal on the substrate. As described below, this relationship may be used to determine values for the reverse the plating current and a duty cycle for the alternating cycles of forward plating current and reverse deplating current for a given process and pattern.

The data in the relationship found by experiment or simulation in the graph 600, may be used to determine a duty cycle and deplating current that will result in a minimized range nonuniformity 610 that ideally approaches zero. An equation may be derived that determines the range nonuniformity based on corresponding plating and deplating conditions as follows.

$$\left(\frac{R}{\mu}\%\right)_{plate/deplate} = \frac{|\beta(1-f)G(\lambda_{plate})j_{plate} - fG(\lambda_{deplate})j_{deplate}|}{j_{target}} \quad (6)$$

The left side of equation (6) represents the average range nonuniformity described above. The right side of equation (6) represents this average range nonuniformity in terms of the physical properties of the pattern, electrochemical bath, etc., and the current densities for the plating step and the deplating step, where f represents the portion of the duty cycle for the plating process, and 1-f represents the portion of the duty cycle for the deplating process.

In order to minimize the overall range nonuniformity for the combined process, the right-hand side of equation (6) combining plating and deplating cycles of the may be set to zero. The only unknown in equation (6) is then the deplating current density ($j_{deplate}$). The plating current density ($j_{plate}$) and the overall current density ($j_{target}$) can be selected for the process. The dimensionless parameters may be determined as described above. Therefore, after setting equation (1) to zero, the resulting expression may be solved for the deplating current density ($j_{deplate}$) needed to minimize the range nonuniformity.

To solve equation (6), $G(\lambda)=A\lambda$, where A is a dimensionless constant representing the slope of the linear relationship from graph 600 (e.g., 29.101 for one particular design), and $\lambda$ is the dimensionless characterization of the operating parameters for the particular process and substrate pattern. By setting the right-hand side of equation (6) to zero, the solution leads to a quadratic equation for the deplating current density ($j_{deplate}$).

$$aj_{deplate}^2 + bj_{deplate} + c = 0 \quad (7)$$

Equation (2) may be solved using the quadratic formula.

$$j_{deplate} = \frac{-b + \sqrt{b^2 - 4ac}}{2a} \quad (8)$$

$$a = 4KA - CD \quad (9)$$

$$b = -C(2B + Dj_{target}) \quad (10)$$

$$c = -2BCj_{target} \quad (11)$$

$$A = 29.101 \quad (12)$$

$$B = \frac{\kappa RT}{\alpha_a F L_{pattern}} \left(\frac{1}{100} \text{ for } ASD\right) \quad (13)$$

$$C = \frac{G(\lambda_{plate})j_{plate}}{j_{plate} - j_{target}} \quad (14)$$

After solving for the deplating current density $j_{deplate}$, this value may be used to determine the f value representing the portion of the duty cycle used for the plating process.

$$f = \frac{j_{plate} - j_{target}}{j_{plate} + j_{deplate}} \quad (15)$$

Note that the value for f only indicates the portion of the duty cycle for each plating/deplating current cycle that will be used for the plating current. The total cycle time (e.g., the frequency of the alternating applications of the plating current and the deplating current) may be selected based on other process considerations.

Figure 7:
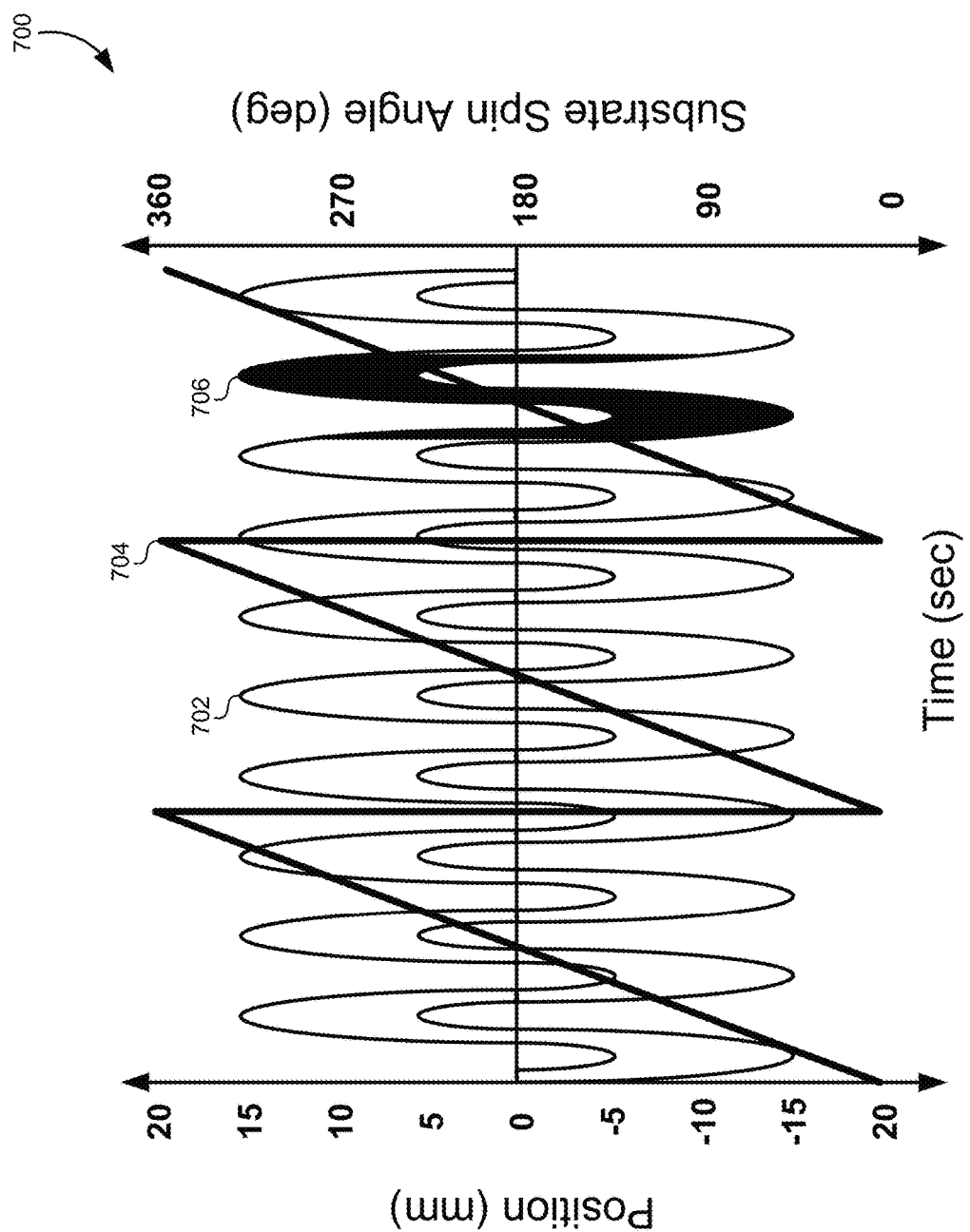
FIG. 7 illustrates a graph of paddle motion and substrate rotation, according to some embodiments.

Additionally, the phase and frequency of the deplating current may be timed such that the deplating current is evenly distributed during other cycles in the plating process. FIG. 7 illustrates a graph of paddle motion and substrate rotation, according to some embodiments. The line 704 indicates an angle of rotation for the substrate during the plating/deplating process. The curve 702 represents the position of a paddle that agitates the liquid chemistry in the plating chamber during the plating process. In some implementations, the position of the paddle may use a staggered periodic motion.

A phase and/or cycle time for the duty cycle of the forward and reverse currents may be selected such that the reverse current is evenly distributed relative to the rotation of the substrate and the motion of the paddle. In graph 700, a section 706 of the curve 702 represents the portion of the duty cycle during which the reverse current is applied. Note that this captures approximately a complete cycle of the paddle motion while also being distributed at different locations in the wafer cycle over time. Using the paddle motion and the wafer of as illustrated in graph 700, the alternating cycles of forward plating current and reverse deplating current can be based at least in part on the rotation speed of the substrate and/or on the motion of the paddle in the plating chamber to ensure that these two current waveforms are applied as evenly as possible in the chamber.

Figure 8:
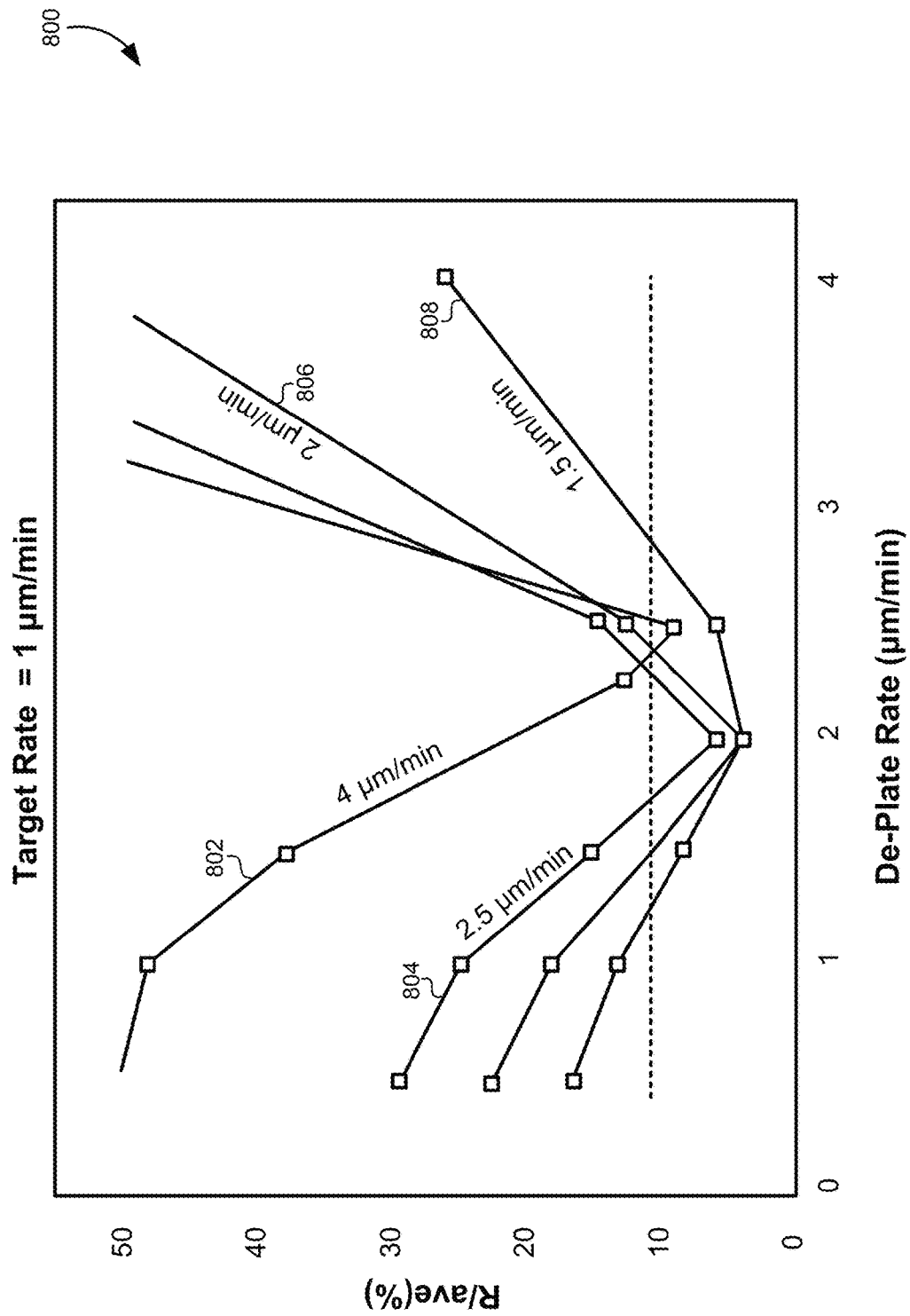
FIG. 8 illustrates characterizing curves that may be generated for a target deposition rate for a specified process.

FIG. 8 illustrates characterizing curves that may be generated for a target deposition rate for a specified process. Using the equations and algorithms described above, the deplating rate can be selected to minimize the range nonuniformity of the material formed on the substrate during the plating process as represented on the y-axis. For example, a set of characterizing curves illustrated in graph 800 may be generated for a target deposition rate of 1 μm/m. Characteristic curves may be generated for different forward plating rates, such as 4 μm/m (curve 802), 2.5 μm permitted (curve 804), 2 μm/m (curve 806), 1.5 μm/m (curve 808), and so forth. The corresponding deplating rate may be selected based on minimums of these characterizing curves.

Figure 9:
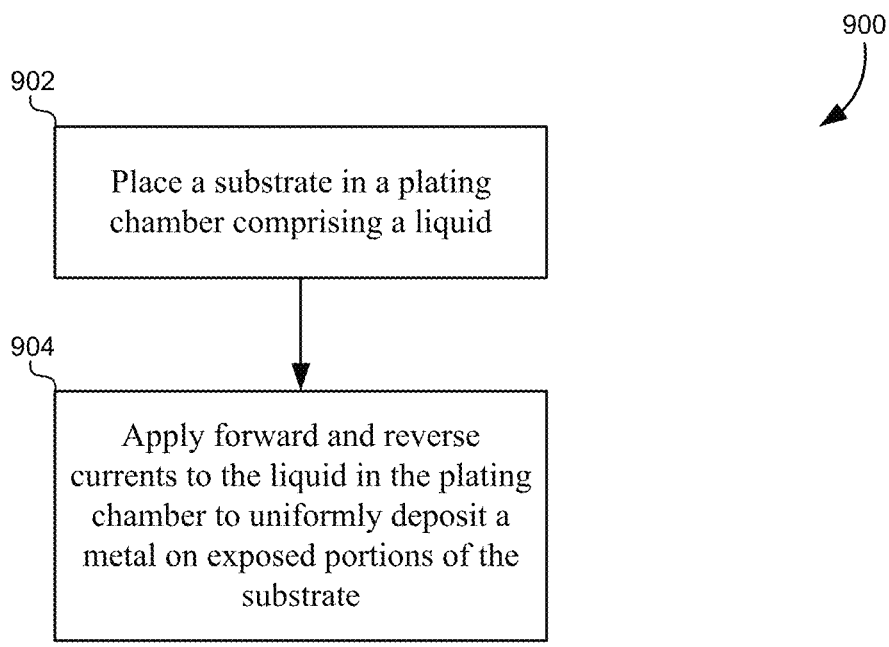
FIG. 9 illustrates a flowchart of a method for plating substrates, according to some embodiments.

FIG. 9 illustrates a flowchart 900 of a method for plating substrates, according to some embodiments. The method may include placing a substrate in a plating chamber comprising a liquid (902). The plating chamber may include an electrochemical deposition chamber, and the liquid may include an electrolyte bath in which the substrate is submerged. The substrate may include a photoresist or mask layer that defines a pattern on the substrate, and the pattern may include exposed portions of the substrate adjacent to an open area on a die. A current density during a plating process may be more concentrated at the exposed portions of the substrate adjacent to the open area when compared to exposed portions of the substrate that are not adjacent to the open area as illustrated above in FIG. 3. The exposed portions of the substrate may include thru-silicon vias (TSVs), and a difference between a maximum height of the TSVs and a minimum height of the TSVs may represent a measure of co-planarity or uniformity of the TSV heights. For example, a max-min value below a threshold may indicate co-planarity, while a max-min value above the threshold may indicate an uneven distribution of material at different locations on the substrate.

The method may also include applying a current to a liquid in the plating chamber to deposit a metal on exposed portions of the substrate (904). The current may include alternating cycles of a forward plating current and a reverse deplating current. During the forward plating current, the metal may be deposited unevenly on the exposed portions of the substrate due to current pooling and other effects. During the reverse deplating current, the metal may be removed such that the metal becomes evenly distributed on the exposed portions of the substrate. This alternating cycle of forward and reverse currents may be duty cycled throughout the plating process to remove errors in co-planarity as they are introduced. For example, the forward plating current and the reverse deplating current may both be applied in alternating cycles in the plating chamber when the substrate is in the liquid without using separate chambers or liquids to apply the forward plating current and the reverse deplating current.

It should be appreciated that the specific steps illustrated in FIG. 9 provide particular methods of plating a substrate according to various embodiments. Other sequences of steps may also be performed according to alternative embodiments. For example, alternative embodiments may perform the steps outlined above in a different order. Moreover, the individual steps illustrated in FIG. 9 may include multiple sub-steps that may be performed in various sequences as appropriate to the individual step. Furthermore, additional steps may be added or removed depending on the particular applications. Many variations, modifications, and alternatives also fall within the scope of this disclosure. These method steps may be carried out on a controller of the plating chamber or a separate computer system.

Figure 10:
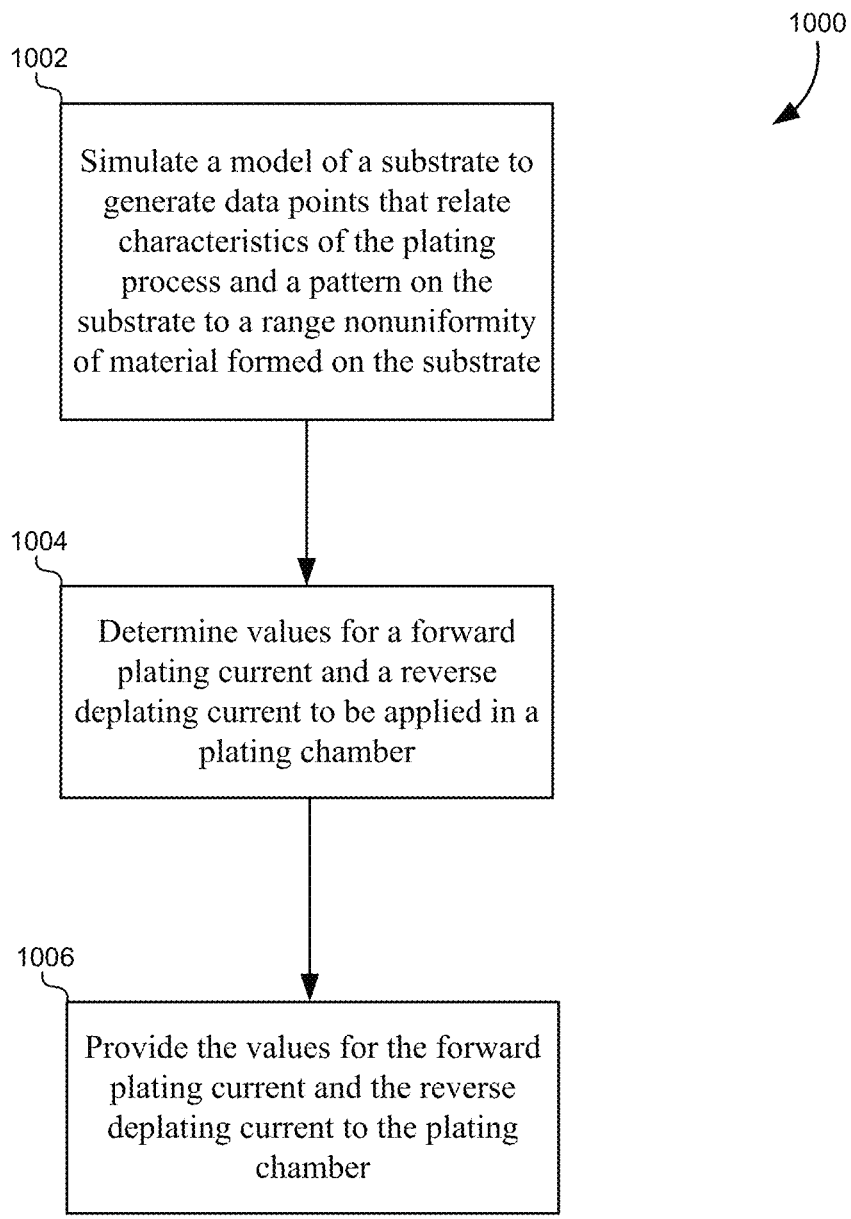
FIG. 10 illustrates a flowchart of a method for determining forward and reverse current values for a plating process, according to some embodiments.

FIG. 10 illustrates a flowchart 1000 of a method for determining forward and reverse current values for a plating process, according to some embodiments. The method may include simulating a model of a substrate in a plating process to generate data points that relate characteristics of the plating process and a pattern on the substrate to a range nonuniformity of material formed on the substrate during the plating process (1002). The simulation may be executed by any computer system, including the computer system described below and/for the controller of the plating chamber. For example, a computer system and/or the controller may access or receive information descriptive of the pattern on the substrate and/or the configuration of the plating chamber and liquid bath, automatically retrieve or generate simulated results, and perform the other steps illustrated in flowchart 1000 without requiring human intervention. These steps may be executed as part of the recipe for the plating process. The data points may be generated as described above in relation to FIG. 6.

The method may also include determining values for a forward plating current and a reverse deplating current to be applied in a plating chamber (1004). The values for the currents may be generated as described above in relation to FIG. 6. For example, the process may receive a target deposition rate and a forward plating rate for the deposition process, then determine a reverse deplating rate and/or a duty cycle for the forward and reverse currents as described above. The current values may also be determined such that a range nonuniformity of the material formed in the substrate during the plating process is minimized.

The method may further include providing the values for the forward plating current and the reverse deplating current to the plating chamber to execute a plating process (1006). For example, the current values may be determined in the simulation may be performed on separate computer systems and provided to the controller of the plating chamber. In some embodiments, the current values may be provided to a plurality of plating chambers that sequentially execute a plating process on a batch of semiconductor substrates having a same pattern.

It should be appreciated that the specific steps illustrated in FIG. 10 provide particular methods of determining forward and reverse current values for a plating process according to various embodiments. Other sequences of steps may also be performed according to alternative embodiments. For example, alternative embodiments may perform the steps outlined above in a different order. Moreover, the individual steps illustrated in FIG. 10 may include multiple sub-steps that may be performed in various sequences as appropriate to the individual step. Furthermore, additional steps may be added or removed depending on the particular applications. Many variations, modifications, and alternatives also fall within the scope of this disclosure.

Each of the methods described herein may be implemented by a computer system. Each step of these methods may be executed automatically by the computer system, and/or may be provided with inputs/outputs involving a user. For example, a user may provide inputs for each step in a method, and each of these inputs may be in response to a specific output requesting such an input, wherein the output is generated by the computer system. Each input may be received in response to a corresponding requesting output. Furthermore, inputs may be received from a user, from another computer system as a data stream, retrieved from a memory location, retrieved over a network, requested from a web service, and/or the like. Likewise, outputs may be provided to a user, to another computer system as a data stream, saved in a memory location, sent over a network, provided to a web service, and/or the like. In short, each step of the methods described herein may be performed by a computer system, and may involve any number of inputs, outputs, and/or requests to and from the computer system which may or may not involve a user. Those steps not involving a user may be said to be performed automatically by the computer system without human intervention. Therefore, it will be understood in light of this disclosure, that each step of each method described herein may be altered to include an input and output to and from a user, or may be done automatically by a computer system without human intervention where any determinations are made by a processor. Furthermore, some embodiments of each of the methods described herein may be implemented as a set of instructions stored on a tangible, non-transitory storage medium to form a tangible software product.

Figure 11:
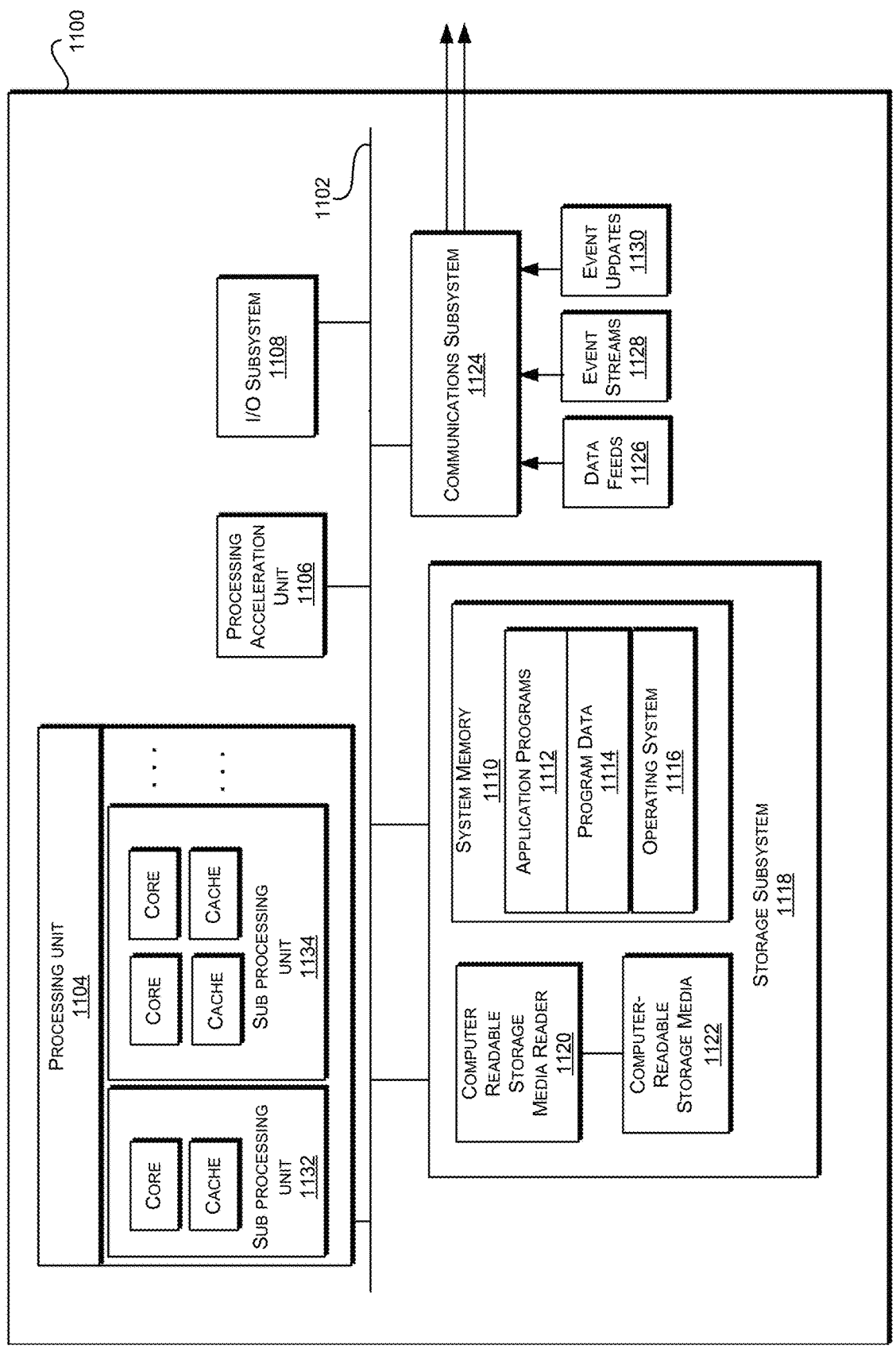
FIG. 11 illustrates an exemplary computer system, in which various embodiments may be implemented.

FIG. 11 illustrates an exemplary computer system 1100, in which various embodiments may be implemented. The system 1100 may be used to implement any of the computer systems described above. As shown in the figure, computer system 1100 includes a processing unit 1104 that communicates with a number of peripheral subsystems via a bus subsystem 1102. These peripheral subsystems may include a processing acceleration unit 1106, an I/O subsystem 1108, a storage subsystem 1118 and a communications subsystem 1124. Storage subsystem 1118 includes non-transitory, tangible, computer-readable storage media 1122 and a system memory 1110. The non-transitory computer-readable medium may store instructions that cause one or more processors to execute operations as described throughout this disclosure.

Bus subsystem 1102 provides a mechanism for letting the various components and subsystems of computer system 1100 communicate with each other as intended. Although bus subsystem 1102 is shown schematically as a single bus, alternative embodiments of the bus subsystem may utilize multiple buses. Bus subsystem 1102 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 1104, which can be implemented as one or more integrated circuits (e.g., a conventional microprocessor or microcontroller), controls the operation of computer system 1100. One or more processors may be included in processing unit 1104. These processors may include single core or multicore processors. In certain embodiments, processing unit 1104 may be implemented as one or more independent processing units 1132 and/or 1134 with single or multicore processors included in each processing unit. In other embodiments, processing unit 1104 may also be implemented as a quad-core processing unit formed by integrating two dual-core processors into a single chip.

In various embodiments, processing unit 1104 can execute a variety of programs in response to program code and can maintain multiple concurrently executing programs or processes. At any given time, some or all of the program code to be executed can be resident in processor(s) 1104 and/or in storage subsystem 1118. Through suitable programming, processor(s) 1104 can provide various functionalities described above. Computer system 1100 may additionally include a processing acceleration unit 1106, which can include a digital signal processor (DSP), a special-purpose processor, and/or the like.

I/O subsystem 1108 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. User interface input devices may include, for example, motion sensing and/or gesture recognition devices such as the Microsoft Kinect® motion sensor that enables users to control and interact with an input device, such as the Microsoft Xbox® 360 game controller, through a natural user interface using gestures and spoken commands. User interface input devices may also include eye gesture recognition devices such as the Google Glass® blink detector that detects eye activity (e.g., 'blinking' while taking pictures and/or making a menu selection) from users and transforms the eye gestures as input into an input device (e.g., Google Glass®). Additionally, user interface input devices may include voice recognition sensing devices that enable users to interact with voice recognition systems (e.g., Siri® navigator), through voice commands.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices. Additionally, user interface input devices may include, for example, medical imaging input devices such as computed tomography, magnetic resonance imaging, position emission tomography, medical ultrasonography devices. User interface input devices may also include, for example, audio input devices such as MIDI keyboards, digital musical instruments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 1100 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 1100 may comprise a storage subsystem 1118 that comprises software elements, shown as being currently located within a system memory 1110. System memory 1110 may store program instructions that are loadable and executable on processing unit 1104, as well as data generated during the execution of these programs.

Depending on the configuration and type of computer system 1100, system memory 1110 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 1104. In some implementations, system memory 1110 may include multiple different types of memory, such as static random access memory (SRAM) or dynamic random access memory (DRAM). In some implementations, a basic input/output system (BIOS), containing the basic routines that help to transfer information between elements within computer system 1100, such as during start-up, may typically be stored in the ROM. By way of example, and not limitation, system memory 1110 also illustrates application programs 1112, which may include client applications, Web browsers, mid-tier applications, relational database management systems (RDBMS), etc., program data 1114, and an operating system 1116. By way of example, operating system 1116 may include various versions of Microsoft Windows®, Apple Macintosh®, and/or Linux operating systems, a variety of commercially-available UNIX® or UNIX-like operating systems (including without limitation the variety of GNU/Linux operating systems, the Google Chrome® OS, and the like) and/or mobile operating systems such as iOS, Windows® Phone, Android® OS, BlackBerry® 10 OS, and Palm® OS operating systems.

Storage subsystem 1118 may also provide a tangible computer-readable storage medium for storing the basic programming and data constructs that provide the functionality of some embodiments. Software (programs, code modules, instructions) that when executed by a processor provide the functionality described above may be stored in storage subsystem 1118. These software modules or instructions may be executed by processing unit 1104. Storage subsystem 1118 may also provide a repository for storing data used in accordance with some embodiments.

Storage subsystem 1100 may also include a computer-readable storage media reader 1120 that can further be connected to computer-readable storage media 1122. Together and, optionally, in combination with system memory 1110, computer-readable storage media 1122 may comprehensively represent remote, local, fixed, and/or removable storage devices plus storage media for temporarily and/or more permanently containing, storing, transmitting, and retrieving computer-readable information.

Computer-readable storage media 1122 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 1100.

By way of example, computer-readable storage media 1122 may include a hard disk drive that reads from or writes to non-removable, nonvolatile magnetic media, a magnetic disk drive that reads from or writes to a removable, non-volatile magnetic disk, and an optical disk drive that reads from or writes to a removable, nonvolatile optical disk such as a CD ROM, DVD, and Blu-Ray® disk, or other optical media. Computer-readable storage media 1122 may include, but is not limited to, Zip® drives, flash memory cards, universal serial bus (USB) flash drives, secure digital (SD) cards, DVD disks, digital video tape, and the like. Computer-readable storage media 1122 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 1100.

Communications subsystem 1124 provides an interface to other computer systems and networks. Communications subsystem 1124 serves as an interface for receiving data from and transmitting data to other systems from computer system 1100. For example, communications subsystem 1124 may enable computer system 1100 to connect to one or more devices via the Internet. In some embodiments communications subsystem 1124 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 1124 can provide wired network connectivity (e.g., Ethernet) in addition to or instead of a wireless interface.

In some embodiments, communications subsystem 1124 may also receive input communication in the form of structured and/or unstructured data feeds 1126, event streams 1128, event updates 1130, and the like on behalf of one or more users who may use computer system 1100.

By way of example, communications subsystem 1124 may be configured to receive data feeds 1126 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 1124 may also be configured to receive data in the form of continuous data streams, which may include event streams 1128 of real-time events and/or event updates 1130, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 1124 may also be configured to output the structured and/or unstructured data feeds 1126, event streams 1128, event updates 1130, and the like to one or more databases that may be in communication with one or more streaming data source computers coupled to computer system 1100.

Computer system 1100 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 1100 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A method of plating substrates, the method comprising:
   determining, for a plating process to be performed on a substrate, a relationship between a range nonuniformity of the plating process, and characteristics of the plating process and a pattern on the substrate;
   determining a duty cycle for a forward plating current and a reverse deplating current from the relationship that minimizes the range nonuniformity;
   placing the substrate in a plating chamber comprising a liquid, wherein the substrate comprises a patterned mask that exposes the substrate through a plurality of vias; and
   applying a current to the liquid in the plating chamber to deposit a metal on exposed portions of the substrate, wherein the current comprises the duty cycle comprising alternating cycles of:
      the forward plating current that deposits the metal unevenly in the plurality of vias at varying heights; and
      the reverse deplating current that removes some of the metal in the plurality of vias such that the metal in the plurality of vias is evenly distributed.

2. The method of claim 1, wherein the patterned mask comprises exposed portions of the substrate adjacent to an open area, wherein a current density during a plating process is more concentrated at the exposed portions of the substrate adjacent to the open area compared to exposed portions of the substrate that are not adjacent to the open area.

3. The method of claim 1, wherein the forward plating current and the reverse deplating current are both applied in the alternating cycles in the plating chamber when the substrate is in the liquid, without using separate chambers or liquids to apply the forward plating current and the reverse deplating current.

4. The method of claim 1, wherein the exposed portions of the substrate comprise a plurality of thru-silicon vias (TSVs), where there exists a difference between a maximum height of the TSVs and a minimum height of the TSVs.

5. The method of claim 1, wherein a phase or cycle time of the duty cycle is selected such that the reverse deplating current is evenly distributed relative to a rotation speed of the substrate in the plating chamber.

6. The method of claim 1, wherein a phase or cycle time of the duty cycle is selected such that the reverse deplating current is evenly distributed relative to a motion of a paddle in the plating chamber.

7. The method of claim 1, wherein the plating chamber comprises an electrochemical deposition chamber, and the liquid comprises an electrolyte.

8. The method of claim 1, wherein the forward plating current is applied at least 10 times as long as the deplating current.

9. The method of claim 1, further comprising:
   receiving a target deposition rate for the plating process;
   receiving a forward plating rate for the plating process; and
   calculating a reverse deplating rate for the plating process based on the target deposition rate, the forward plating rate, and the relationship between the range nonuniformity of the plating process and the characteristics of the plating process and the pattern on the substrate.

10. The method of claim 1, further comprising:
    calculating a reverse deplating current density for the plating process based at least in part on the relationship between the range nonuniformity of the plating process and the characteristics of the plating process and the pattern on the substrate.

11. The method of claim 1, wherein the relationship between the range nonuniformity of the plating process and the characteristics of the plating process and the pattern on the substrate comprises a linear relationship.

12. The method of claim 1, wherein the relationship between the range nonuniformity of the plating process and the characteristics of the plating process and the pattern on the substrate comprises a nonlinear relationship.

13. The method of claim 1, wherein the characteristics of the plating process comprise a bath conductivity in a film resistance.

14. The method of claim 1, wherein the pattern on the substrate comprises a characteristic length of the pattern and a width of the pattern.

15. The method of claim 1, wherein determining the relationship between the range nonuniformity of the plating process, and the characteristics of the plating process and the pattern on the substrate comprises:
   collecting data points from experimental data using different bath conductivities and plating rates to characterize the range nonuniformity.

16. The method of claim 1, wherein the alternating cycles of the forward plating current and reverse deplating current are applied evenly relative to a rotation speed of the substrate and a motion of a paddle in the plating chamber.

17. The method of claim 1, wherein determining the relationship between the range nonuniformity of the plating process, and the characteristics of the plating process and the pattern on the substrate comprises:
   simulating a model of the substrate during a plating process to generate data points that relate the characteristics of the plating process and the pattern on the substrate to a predicted range nonuniformity of the metal on the substrate for the forward plating current and the reverse deplating current.

18. The method of claim 17, further comprising, prior to applying the current to the liquid in the plating chamber:
   determining a value for the reverse deplating current using the data points that relate the characteristics of the plating process and the pattern on the substrate to the predicted range nonuniformity of the metal on the substrate.

19. The method of claim 17, further comprising, prior to applying the current to the liquid in the plating chamber:
   determining the duty cycle for the alternating cycles of the forward plating current and the reverse deplating current using the data points that relate the characteristics of the plating process and the pattern on the substrate to the predicted range nonuniformity of the metal on the substrate.

20. A system comprising:
   a plating chamber comprising a liquid configured to receive a substrate comprising a patterned mask that exposes the substrate through a plurality of vias; and
   a controller configured to perform operations comprising:
   determining, for a plating process to be performed on the substrate, a relationship between a range nonuniformity of the plating process, and characteristics of the plating process and a pattern on the substrate;
   determining a duty cycle for a forward plating current and a reverse deplating current from the relationship that minimizes the range nonuniformity; and
   causing a current to be applied to the liquid in the plating chamber to deposit a metal on exposed portions of the substrate, wherein the current comprises alternating cycles of: the forward plating current that deposits the metal unevenly in the plurality of vias at varying heights; and
   the reverse deplating current that removes some of the metal in the plurality of vias such that the metal in the plurality of vias is evenly distributed.

* * * * *